(12) United States Patent
Bedarida et al.

(10) Patent No.: US 7,177,198 B2
(45) Date of Patent: Feb. 13, 2007

(54) COMPENSATED METHOD TO IMPLEMENT A HIGH VOLTAGE DISCHARGE PHASE AFTER ERASE PULSE IN A FLASH MEMORY DEVICE

(75) Inventors: Lorenzo Bedarida, Milan (IT); Simone Bartoli, Via Monte Bianco (IT); Giorgio Oddone, Genoa (IT); Davide Manfre', Bologna (IT)

(73) Assignee: Atmel Corporation, San Jose, CA (US)

( * ) Notice: Subject to any disclaimer, the term of this patent is extended or adjusted under 35 U.S.C. 154(b) by 71 days.

(21) Appl. No.: 11/123,979

(22) Filed: May 6, 2005

(65) Prior Publication Data
US 2006/0062063 A1 Mar. 23, 2006

(30) Foreign Application Priority Data
Sep. 21, 2004 (IT) .......................... MI2004A1802

(51) Int. Cl.
*G11C 11/34* (2006.01)
(52) U.S. Cl. .............................. 365/185.25; 365/185.29
(58) Field of Classification Search ........... 365/185.25, 365/185.29, 185.27, 185.26
See application file for complete search history.

(56) References Cited
U.S. PATENT DOCUMENTS

| | | | |
|---|---|---|---|
| 4,363,109 A * | 12/1982 | Gardner, Jr. ............. | 365/185.1 |
| 5,552,621 A * | 9/1996 | Kowalski ..................... | 257/321 |
| 5,608,684 A | 3/1997 | Reasoner et al. | |
| 5,721,440 A * | 2/1998 | Kowalski ..................... | 257/300 |
| 6,198,662 B1 | 3/2001 | Chen et al. | |
| 6,219,281 B1 | 4/2001 | Chen et al. | |
| 6,335,879 B1 | 1/2002 | Matsubara et al. | |
| 6,751,118 B2 | 6/2004 | Tran et al. | |

* cited by examiner

*Primary Examiner*—Anh Phung
(74) *Attorney, Agent, or Firm*—Sawyer Law Group LLP

(57) ABSTRACT

A method for discharge in a flash memory device includes: initiating a discharge of a memory cell after an erase operation; coupling a first discharge circuit to a first plate of a gate-bulk capacitor, and a second discharge circuit to a second plate of the gate-bulk capacitor, where the first plate represents the common gate node of the memory cell and the second plate represents the bulk-source node of the memory cell; and coupling the common gate node and the bulk-source node to ground to provide for a complete discharge. The current injected into the first plate approximately equals the current extracted from the second plate. In this manner, dangerous oscillations of the gate and bulk-source voltages as they go to ground are eliminated without complicated designs or voltage limitators, and without sacrificing the fast discharge after the erase operation. The reliability of the discharge operation is thus significantly improved.

9 Claims, 4 Drawing Sheets

COMPENSATED METHOD TO IMPLEMENT A HIGH VOLTAGE DISCHARGE PHASE AFTER ERASE PULSE IN A FLASH MEMORY DEVICE

CROSS-REFERENCE TO RELATED APPLICATIONS

This application claims benefit under 35 USC 119 of Italian Application no. MI2004A 001802, filed on Sep. 21, 2004.

FIELD OF THE INVENTION

The present invention relates to flash memory devices, and more particularly to the high voltage discharge of flash memory devices in an erase operation.

BACKGROUND OF THE INVENTION

It is desirable for memory flash devices with NOR-architecture to be able to complete the erase operations with sufficiently fast timing. Normally, these devices use the Fowler-Nordheim Tunneling to perform the erase operations. With this methodology, high voltages are applied contemporaneously to the memory cells to be erased. The erase operation then completes by discharging these high voltages to ground. However, there is a trade-off between the speed and the reliability of the erase operation. To obtain a proper balance between the two, voltages in the order of 7 to 9V for the positive voltage, and −8 to −10V for the negative voltage, are typically used. Two techniques are available for the positive voltage: a positive voltage is applied only to the bulk node; or a positive voltage is applied to the bulk node and to the source node of the memory cells. In this specification, only the second method is analyzed but either technique can be applied.

FIG. 1 illustrates a simplified physical and electrical model to represent the conventional erase phases performed on a sector of a memory device. The electrical model is composed of three capacitors: Cggnd 101, Cgb 102, and Cbgnd 103. Cgb 102 represents the gate-bulk capacitor, which has a capacitance equal to the total gate capacitance of the sector to be erased versus the common cell bulk-source node. The top plate of Cgb 102 represents the common gate node 104, and the bottom plate represents the bulk-source node 105. Cggnd 101 represents the capacitance of the gate node 104 versus all other nodes except the bulk-source node 105 (Node 1), and Cbgnd 103 represents the capacitance of the bulk-source node 105 versus all other nodes except the gate node 104 (Node 2). Fowler-Nordheim Tunneling erase is performed by applying a negative voltage on the gate node 104 and a positive voltage on the bulk-source node 105. With the voltages above, the total voltage seen by Cgb 102 is in the order of approximately 20V.

Since the capacitance value of all gates is relatively high, by capacitive coupling, the gate node 104 (starting from −8/−10V) can reach a high negative voltage during bulk-source discharge. Moreover, the bulk-source node 105 can reach a high positive voltage during gate discharge in the same way. This value is very dangerous for all internal MOS devices which can tolerate, normally, a voltage difference no higher than 11V. After 11V, serious reliability problems occur. Thus, it's very important to control these discharge phases after the erase operations with special circuitry to anticipate reliability problems.

FIG. 2 illustrates one conventional approach for preventing reliability problems caused by reached voltage exiting from erase operations. Here, the top plate and bottom plate of Cbg 202 are coupled together via the initial discharge circuit 204 before discharging the gate node 104 and the bulk-source node 105 to ground. FIG. 2 also includes a digital control circuit 205 that completes the discharge operation by connecting to ground the gate node 104 and the bulk-source node 105. The discharge operation is controlled because the gate node voltage variation cannot be lower than the initial voltage, and the bulk-source voltage variation cannot be higher than the initial voltage. For example, if Cggnd=Cbgnd and the start absolute voltage is the same for the gate node 104 and the bulk-source node 105, the Cgb plates will be discharged to the same value of zero.

In the case with Cggnd>>>Cbgnd or Cggnd<<<Cbgnd, the node with a bigger capacitance versus all other nodes will tend to keep the initial voltage value while the other voltage node will decrease its value quickly. The positive and negative voltages will have their absolute values reduced without dangerous drop or overshoot. The gate and source/bulk voltages will go to ground without dangerous oscillations.

However, with this approach, the initial discharge circuit 204 is required to work between −8/−10V (gate voltage) and 7/9V (bulk-source voltage). This requires a complicated design, where voltage limitators may be necessary in order for the circuit to work with initial voltages near 20V.

Accordingly, there exists a need for an improved method for high voltage discharge phase after an erase pulse in a flash memory device. The improved method should address reliability concerns due to the high voltage without complicated designs or voltage limitators, while also providing a fast discharge time after erase operations. The present invention addresses such a need.

SUMMARY OF THE INVENTION

A method for discharge in a flash memory device includes: initiating a discharge of a memory cell after an erase operation; coupling a first discharge circuit to a first plate of a gate-bulk capacitor, and a second discharge circuit to a second plate of the gate-bulk capacitor, where the first plate represents the common gate node of the memory cell and the second plate represents the bulk-source node of the memory cell; and coupling the common gate node and the bulk-source node to ground to provide for a complete discharge. The current injected into the first plate approximately equals the current extracted from the second plate. In this manner, dangerous oscillations of the gate and bulk-source voltages as they go to ground are eliminated without complicated designs or voltage limitators, and without sacrificing the fast discharge after the erase operation. The reliability of the discharge operation is thus significantly improved.

DETAILED DESCRIPTION

The present invention provides an improved method for high voltage discharge phase after an erase pulse in a flash memory device. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 3 and 4 in conjunction with the discussion below.

Figure 1:
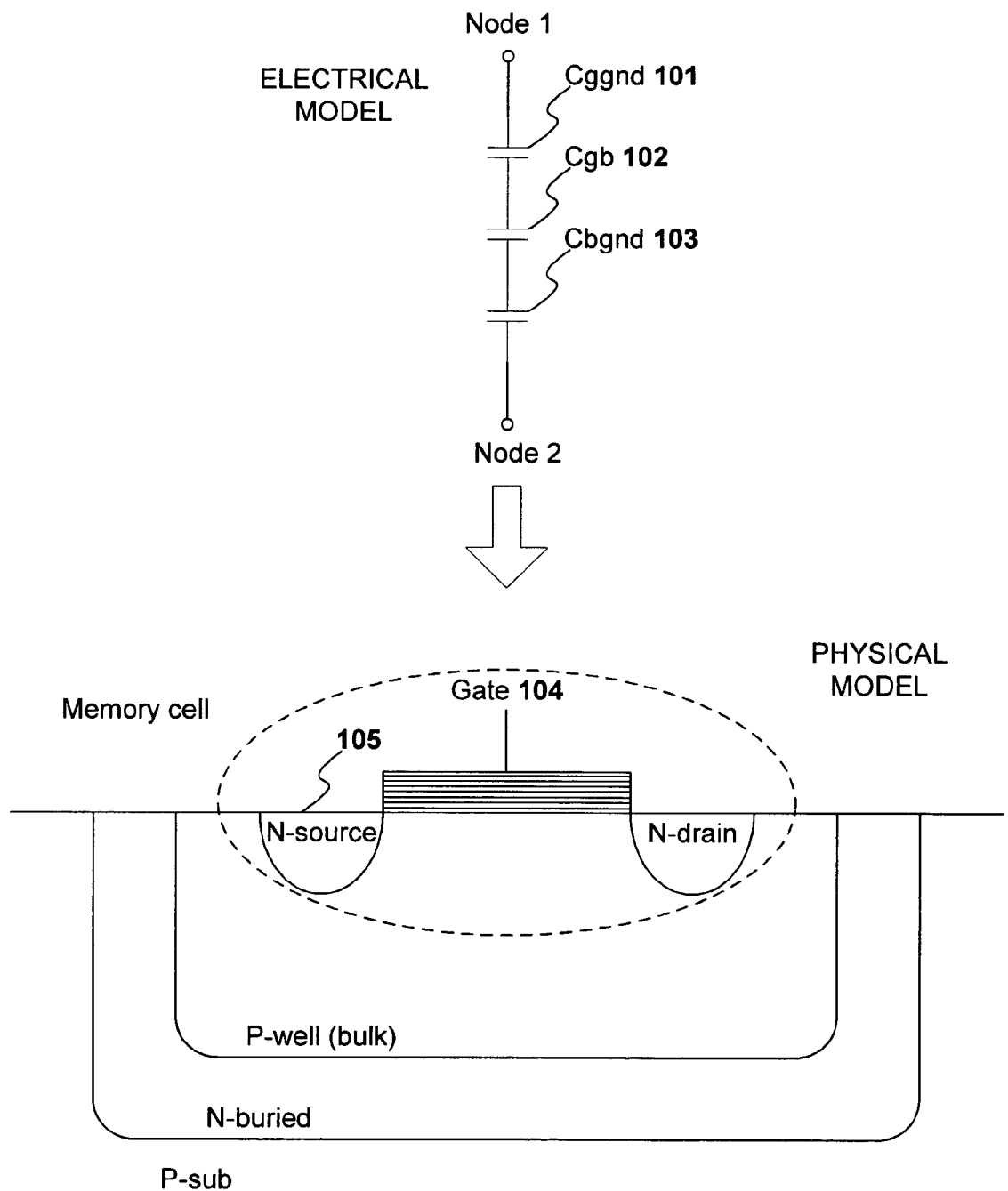
FIG. 1 illustrates a simplified physical and electrical model to represent the conventional erase phases performed on a sector of a memory device.
Figure 2:
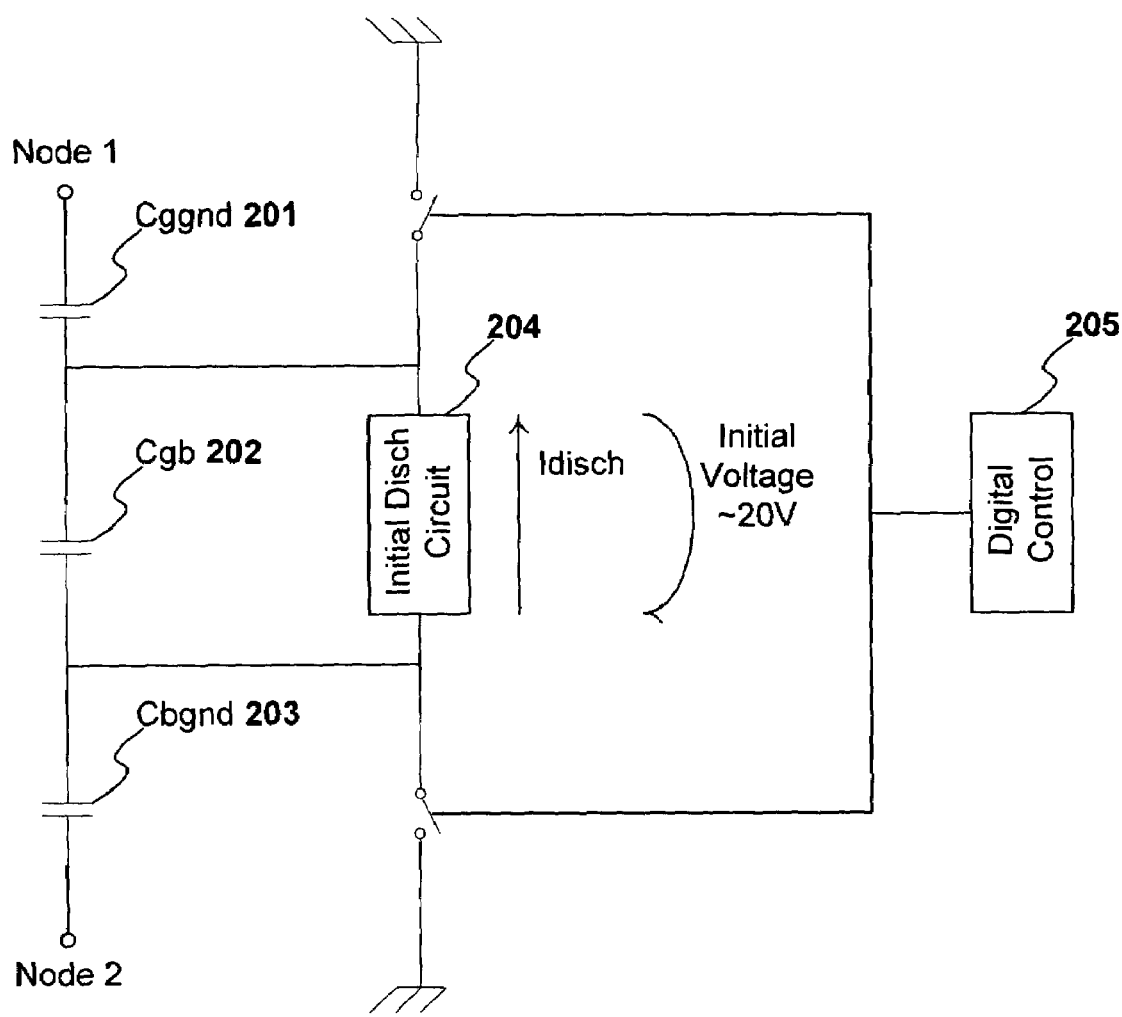
FIG. 2 illustrates one conventional approach for preventing reliability problems caused by reached voltage exiting from erase operations.
Figure 3:
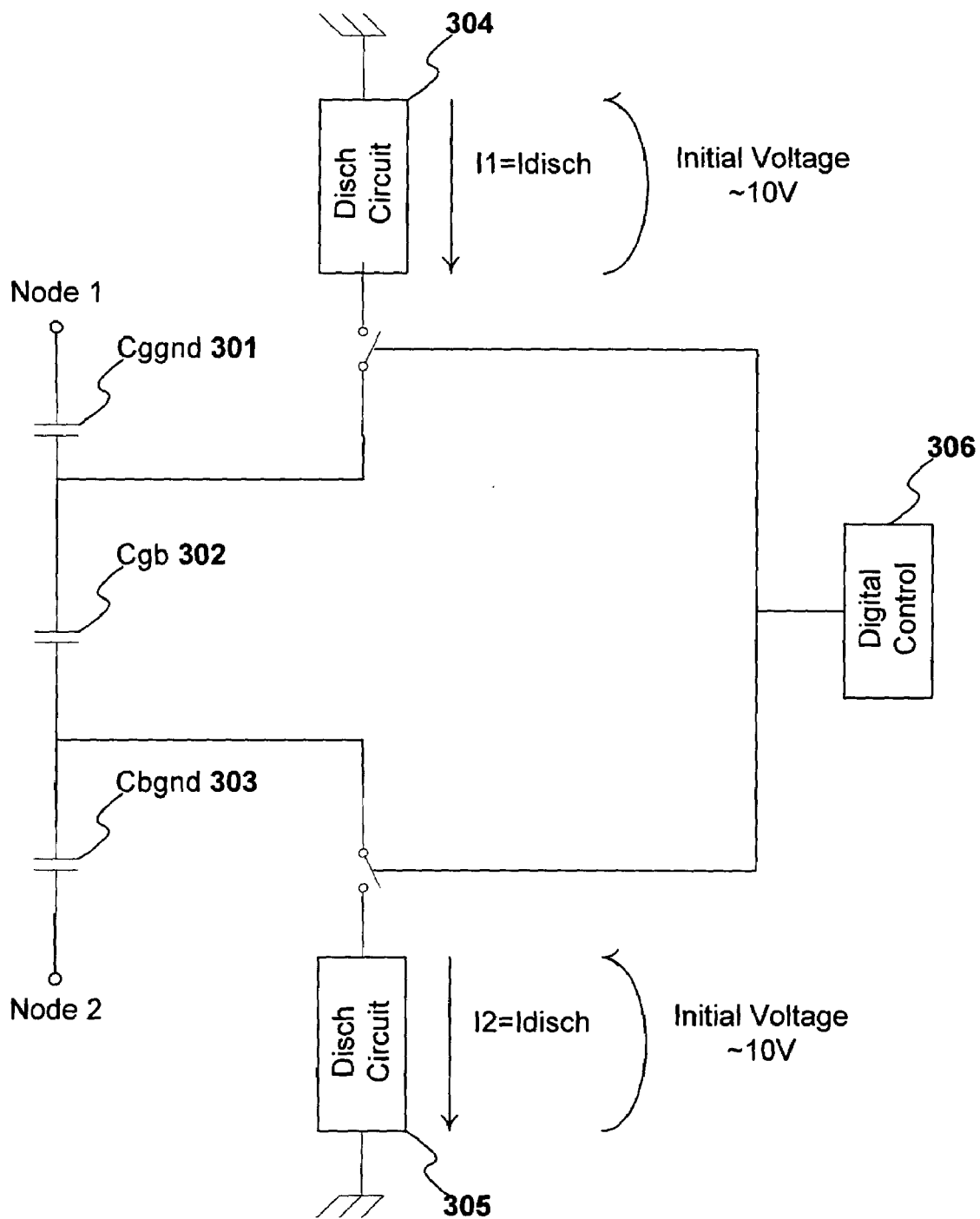
FIGS. 3 and 4 illustrate an electrical model and a flow-chart, respectively, of a preferred embodiment of method for high voltage discharge phase after an erase pulse in a flash memory device in accordance with the present invention.
Figure 4:
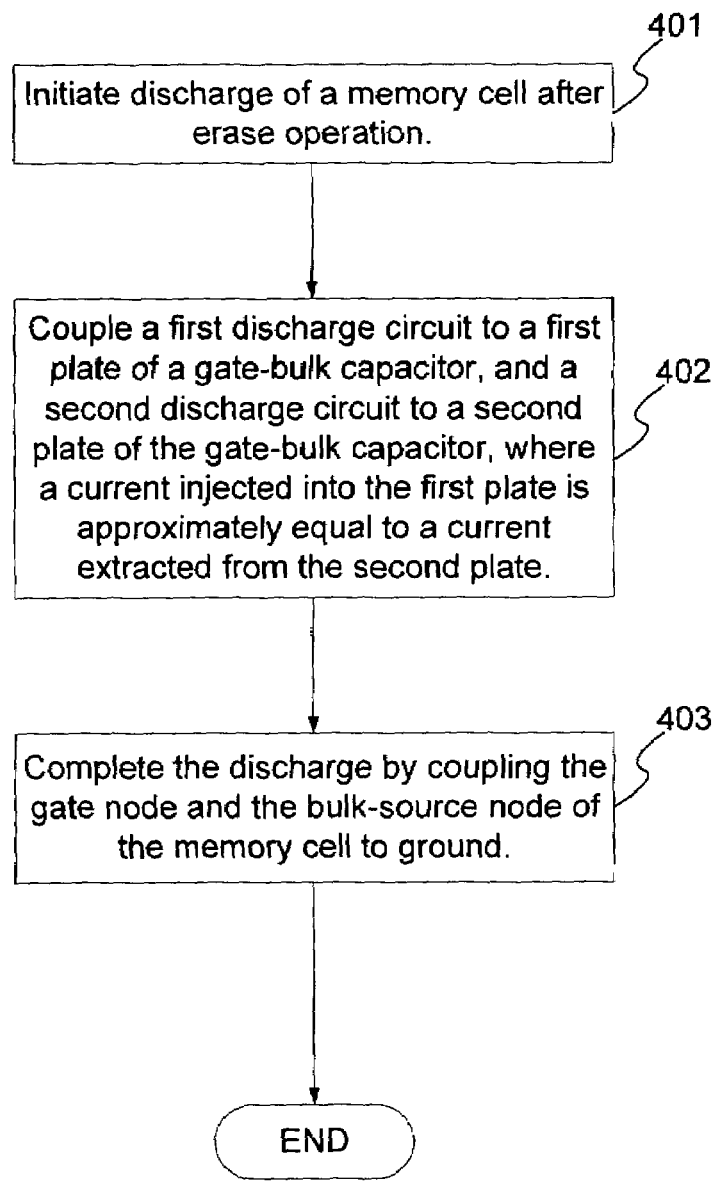

FIGS. 3 and 4 illustrate an electrical model and a flowchart, respectively, of a preferred embodiment of method for high voltage discharge phase after an erase pulse in a flash memory device in accordance with the present invention. The electrical model is composed of three capacitors: Cggnd 301, Cgb 302, and Cbgnd 303. Cgb 302 represents the gate-bulk capacitor, Cggnd 301 represents the capacitance of the gate node 104 versus Node 1, and Cbgnd 303 represents the capacitance of the bulk-source node versus Node 2. The top plate of Cgb 302 represents the common gate node, and the bottom plate represents the bulk-source node.

Referring to both FIGS. 3 and 4, when the discharge of a memory cell is initiated, via step 401, the discharge circuits 304–305 are coupled to the first (top) and second (bottom) plates of Cgb 302, respectively, via step 402. The discharge circuits 304–305 keep the current injected into the top plate of Cgb 302 approximately equal to the current extracted from the bottom plate (I1=I2). Thus, when voltage in the order of 7V to 9V for the positive voltage, and −8V to −10V for the negative voltage are used in the erase operation, the maximum absolute voltage seen by the gate discharge circuit 304 for the gate discharger is approximately 8V–10V, and the absolute voltage seen by the bulk-source discharge circuit 305 is approximately 7V–9V. After this initial discharge, the digital control circuit 306 completes the discharge operation by coupling the gate node and the bulk-source node to ground, via step 403. Neither complicated designs nor voltage limitators are required to keep the discharge circuits 304–305 operating at these appropriate initial voltages.

An improved method for high voltage discharge phase after an erase pulse in a flash memory device has been disclosed. The method couples discharge circuits to the top and bottom plates of the gate-bulk capacitor during the initial discharge of a memory cell, such that the current injected into the top plate approximately equals the current extracted from the bottom plate. In this manner, dangerous oscillations of the gate and bulk-source voltages as they go to ground without complicated designs or voltage limitators, and without sacrificing the fast discharge after the erase operation. The reliability of the discharge operation is thus significantly improved.

To further minimize drop or overshoot, it is possible to use a matrix N-buried big capacitance (versus ground) to load the bulk-source node. If during the discharge phases, the bulk-source node and the N-buried node are connected together, and discharged together, possible oscillations on these nodes are automatically reduced because their capacitance to ground is increased. Then, it is possible to simplify the design of the discharge circuits 304–305 (see FIG. 3) because a little difference between I1 and I2 would be acceptable.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for discharge in a flash memory device, comprising:

initiating a discharge of a memory cell after an erase operation;

coupling a first discharge circuit to a first plate of a gate-bulk capacitor, and a second discharge circuit to a second plate of the gate-bulk capacitor, wherein the first plate represents the common gate node of the memory cell and the second plate represents the bulk-source node of the memory cell versus ground; and coupling the common gate node and the bulk-source node to ground to provide for a discharge.

2. The method of claim 1, wherein a current injected into the first plate is approximately equal to a current extracted from the second plate.

3. The method of claim 1, wherein the first plate of the gate-bulk capacitor is coupled to a capacitor representing a capacitance of a gate node of the memory cell versus all other nodes except the bulk-source node.

4. The method of claim 1, wherein the second plate of the gate-bulk capacitor is coupled to a capacitor representing a capacitance of the bulk-source node versus all other nodes except a gate node.

5. A flash memory device, comprising:

a gate-bulk capacitor comprising: a first plate representing a common gate node of a memory cell of the flash memory device, and a second plate representing a bulk-source node of the memory cell;

a first discharge circuit; and a second discharge circuit, wherein when a discharge of the memory cell after an erase operation is initiated, the first discharge circuit is coupled to the first plate and the second discharge circuit is coupled to the second plate, wherein the common gate node and the bulk-source node are then coupled to ground to provide for a substantially complete discharge.

6. The device of claim 5, wherein a current injected into the first plate is approximately equal to a current extracted from the second plate.

7. The device of claim 5, wherein the first plate of the gate-bulk capacitor is coupled to a capacitor representing a capacitance of a gate node of the memory cell versus al other nodes except the bulk-source node.

8. The device of claim 5, wherein the second plate of the gate-bulk capacitor is coupled to a capacitor representing a capacitance of the bulk-source node versus all other nodes except a gate node.

9. The device of claim 5, further comprising:

a digital control circuit for controlling the coupling of the common gate node and the bulk-source node to ground.

* * * * *